(12) United States Patent
Aoki et al.

(10) Patent No.: US 7,510,093 B2
(45) Date of Patent: Mar. 31, 2009

(54) METHOD OF MANUFACTURING A WIRING SUBSTRATE, METHOD OF MANUFACTURING AN ELECTRO-OPTICAL DEVICE, METHOD OF MANUFACTURING AN ELECTRONIC APPARATUS

(75) Inventors: Takashi Aoki, Suwa (JP); Takashi Masuda, Suwa (JP); Hideki Tanaka, Chino (JP); Ichio Yudasaka, Chino (JP)

(73) Assignee: Seiko Epson Corporation, Tokyo (JP)

( * ) Notice: Subject to any disclaimer, the term of this patent is extended or adjusted under 35 U.S.C. 154(b) by 206 days.

(21) Appl. No.: 11/200,162

(22) Filed: Aug. 10, 2005

(65) Prior Publication Data

US 2006/0037935 A1    Feb. 23, 2006

(30) Foreign Application Priority Data

Aug. 20, 2004   (JP)   ............... 2004-241316

(51) Int. Cl.
*H01B 13/00* (2006.01)
*H01L 21/302* (2006.01)

(52) U.S. Cl. ............ 213/13; 216/24; 216/83; 438/745; 427/58

(58) Field of Classification Search .......... 216/13, 216/24, 83; 438/745; 427/58
See application file for complete search history.

(56) References Cited

U.S. PATENT DOCUMENTS

| | | | |
|---|---|---|---|
| 5,132,248 A | * | 7/1992 | Drummond et al. ........ 505/325 |
| 6,849,308 B1 | * | 2/2005 | Speakman et al. .......... 427/595 |
| 2003/0057512 A1 | * | 3/2003 | Sterzel et al. ............... 257/467 |
| 2003/0083203 A1 | * | 5/2003 | Hashimoto et al. ......... 505/100 |
| 2003/0157244 A1 | * | 8/2003 | Kawase ........................ 427/58 |
| 2004/0029382 A1 | * | 2/2004 | Kawase ....................... 438/689 |
| 2005/0153468 A1 | * | 7/2005 | Gupta et al. .................. 438/21 |

FOREIGN PATENT DOCUMENTS

| | | | |
|---|---|---|---|
| JP | A-11-66654 | | 3/1999 |
| JP | 2003-318516 | * | 7/2003 |
| JP | A 2003-243328 | | 8/2003 |
| JP | A 2003-315813 | | 11/2003 |
| JP | A 2005-28275 | | 2/2005 |
| JP | A 2005-28276 | | 2/2005 |
| JP | A 2005-28279 | | 2/2005 |
| WO | WO 2004/070811 A1 | | 8/2004 |

OTHER PUBLICATIONS

U.S. Appl. No. 10/935,242, filed Sep. 8, 2004, Masuda.
U.S. Appl. No. 10/959,998, filed Oct. 8, 2004, Masuda et al.

* cited by examiner

*Primary Examiner*—Shamim Ahmed
(74) *Attorney, Agent, or Firm*—Oliff & Berridge, PLC

(57) ABSTRACT

An etching method of the invention includes arranging droplets including a film-forming material on a substrate, drying each of the droplets to form a dry film having a width smaller than the diameter of each droplet at the time of the arrangement, and performing etching while using the dry film as an etching protective film.

9 Claims, 7 Drawing Sheets

FIG. 2A  FIG. 2B  FIG. 2C  FIG. 2D
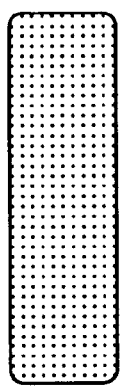 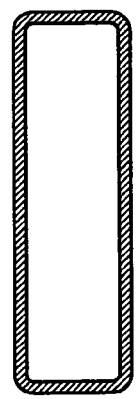 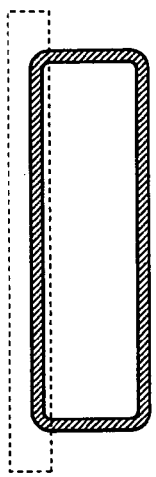 
FIG. 3
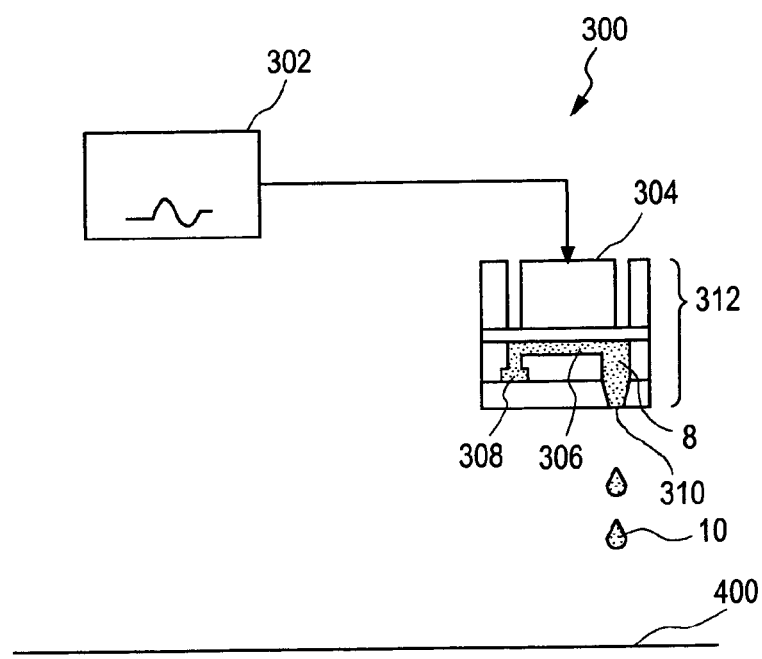

METHOD OF MANUFACTURING A WIRING SUBSTRATE, METHOD OF MANUFACTURING AN ELECTRO-OPTICAL DEVICE, METHOD OF MANUFACTURING AN ELECTRONIC APPARATUS

This application claims the benefit of Japanese Patent Application No. 2004-241316, filed Aug. 20, 2004. The entire disclosure of the prior application is hereby incorporated by reference herein in its entirety.

BACKGROUND

The present invention relates to a method of manufacturing a wiring substrate.

Generally, metal wiring lines, such as gate electrodes, used in thin film transistors (TFTs) or LSI are formed by etching using photolithography. However, this wiring line forming method requires a plurality of processes, such as forming a resist film and forming a pattern, and increases the manufacturing cost in terms of the manufacturing cost of masks, the disposal cost of a large amount of waste developer, or the like.

In order to cope with these problems, a technique in which a liquid material is coated by using an inkjet method, etc. to form metal wiring lines has recently been developed. Since this technique does not require a high-cost etching process, it is expected to require low cost and to place less burden on the environment. For example, Japanese Unexamined Patent Application Publication No. 2003-315813 discloses a method of manufacturing a wiring film which makes it possible to realize fine lines and increase the adhesion strength of wiring lines to a substrate.

However, when a solution process such as the inkjet method or a vapor deposition method is used, typically, the processing dimension is about 1 to 20 microns. Accordingly, this dimension is insufficient to satisfy the requirement of making wiring lines finer.

SUMMARY

An advantage of the invention is that it provides an etching method which makes it possible to form a fine pattern through a simple process.

According to a first aspect of the invention, an etching method includes arranging droplets including a film-forming material on a substrate, drying each of the droplets to form a dry film having a width smaller than the diameter of each droplet at the time of the arrangement, and performing etching while using the dry film as an etching protective film.

According to the etching method, each of droplets arranged on the substrate is dried to form a dry film having a width smaller than the diameter of each droplet at the time of the arrangement, and the dry film is used as an etching protective film. Therefore, since it is possible to form an etching protective film smaller than the diameter of a droplet to be arranged, a finer structure can be formed. Further, since the etching method does not need the photolithography process, the manufacturing process can be simplified without requiring a plurality of processes such as forming a pattern. In addition, when the dry film is a line, its width means the width of the line, and when the dry film is a dot, its width means the diameter of the dot. As the method of arranging droplets, a droplet discharge method, a dispenser method or the like can be exemplified. It is noted herein that the droplet discharge method is more preferable than the dispenser method in that liquid can be easily and precisely arranged at desired positions or in a desired pattern.

During the formation of the dry film, the dry film can be formed into a dry film that is narrower than a droplet at the time of its arrangement by precipitating a dry film forming component contained in the droplet in the vicinity of a certain position.

Specifically, during the formation of the dry film, the dry film may be formed at the edge of the droplet. Further, during the formation of the dry film, the dry film may be formed in the vicinity of the center of the droplet.

The dry film may be formed by repeating the arrangement of droplets and the formation of the dry film. This allows a pattern of an etching protective film to be formed more freely.

The etching method may further include patterning the dry film by removing a portion of the dry film after forming the dry film. This allows a pattern of an etching protective film to be formed more freely.

Another aspect of the invention is a method of manufacturing a fine structure includes forming a fine pattern by using the above etching method. According to the method of manufacturing a fine structure, since the above etching method is used, a structure with a fine pattern can be formed through simple processes. Further, when a fine structure such as fine lines is formed by a droplet discharge method such as a so-called inkjet method of related art, droplets are superposed on a substrate a plurality of times so as to adjust the thickness of fine lines to be formed. Therefore, there is a limit to the thickness of fine lines which can be formed. However, according to the aspect of the invention, since the thickness of fine lines can be adjusted by the thickness of a film to be etched and the etching depth thereof, the design width of a fine structure increases. In addition, the fine structure is not particularly limited as long as it has fine structure such as fine lines. For example, the fine structure includes thin film transistors having fine electrodes (for example, source electrodes, drain electrodes and gate electrodes), or organic EL elements having a fine bank structure which defines pixels.

Still another aspect of the invention is a method of forming conductive lines, which includes arranging droplets including a film-forming material on a substrate having a conductive layer formed on the surface thereof, drying each of the droplets to form a dry film having a width smaller than the diameter of each droplet at the time of the arrangement, and etching the conductive layer while using the dry film as an etching protective film.

According to the method for manufacturing a conductive line, conductive lines in a high-functional and fine pattern can be formed through simple processes. When conductive lines are formed by the inkjet method, etc., not only the capability of discharging a material for forming the conductive lines is limited, but also the performance of the conductive lines, such as resistance values or work functions, is not sufficiently exhibited as compared to a method of forming a film by using a deposition method such as a physical vapor deposition (PVD) method or a chemical vapor deposition (CVD) method. However, according the above method, since the conductive lines are formed not by discharge, but by etching of a conductive layer, it is possible to use various materials for forming the conductive lines. Accordingly, it is possible to provide devices with good performance.

Preferably, the etching protective film is made of a conductive material. According to this configuration, since the etching protective film can be used as a portion of a conductive line as it is without being removed, and the sectional area of the conductive line can be increased, a larger amount of current is allowed to flow through the conductive line.

Preferably, the etching protective film is made of a non-conductive material. According to this configuration, it is possible to use various materials which constitute the etching protective film and to thus use materials having properties, which are more suitable as the etching protective film.

It is possible to make the width of the dry film at the time of the formation of the dry film equal to or less than, for example, ½, 1/10 and 1/100 of the diameter of each droplet at the time of the arrangement.

Further still another aspect of the invention is a method of manufacturing thin film transistors, which includes forming wiring lines and/or electrodes by using the above method of forming conductive lines. According to this method of manufacturing thin film transistors, since the above method of forming conductive lines is used, it is possible to obtain thin film transistors, which can be highly integrated and has low power consumption, by a simple method.

Further still another aspect of the invention is a method of manufacturing an electronic apparatus, which includes manufacturing thin film transistors by using the method of manufacturing thin film transistors. According to this method of manufacturing an electronic apparatus, since the above method of manufacturing thin film transistors, it is possible to obtain an electronic apparatus with low power consumption by a simple method.

BRIEF DESCRIPTION OF THE DRAWINGS

The invention will be described with reference to the accompanying drawings, wherein like numbers reference like elements, and wherein:

FIG. 2 is a view for explaining an example of a method of patterning a dry film;

FIG. 3 is a view showing a configuration of an inkjet head used in a first embodiment;

DETAILED DESCRIPTION OF EMBODIMENTS

Hereinafter, the invention will be described with reference to the accompanying drawings.

(Basic Principle)

First, the basic principle of a method of forming a dry film that becomes an etching protective film will be described in brief.

In the invention, a dry film is formed in various shapes by controlling a method of drying droplets including a film-forming material arranged on a substrate, and an etching protective film is formed by further patterning the dry film as required. Specifically, it is possible to variously control the shape of the dry film by drying the dry film while appropriately changing the concentration of a solid content, such as a film-forming material, contained in droplets, the drying rate of the droplets, or if the solid content is fine particles, the diameter of the droplets, or the like.

Here, the film-forming material means a material for forming a dry film to be used as an etching protective film. Accordingly, the film-forming material is not particularly limited as long as it can function as the etching protective film. For example, the film-forming material may be an organic material such as a resin (for example, polystyrene) or an inorganic material such as metallic fine particles and silicon oxide films. The film-forming material is appropriately selected depending on the kinds of targets to be etched. The above film-forming materials may be used independently or as a mixture of a plurality of kinds of materials. Further, as the liquid for dispersing or dissolving the film-forming material, any liquids such as water or organic solvents such as alcohol solvents or ether-based solvents may be used. The liquids are appropriately selected depending on the material to be used, drying conditions, films to be etched, and the like. In addition, the film-forming material may be dissolved or dispersed in a liquid. Further, various properties of the solution may be adjusted by adding a surfactant to the film-forming material.

Figure 1A:
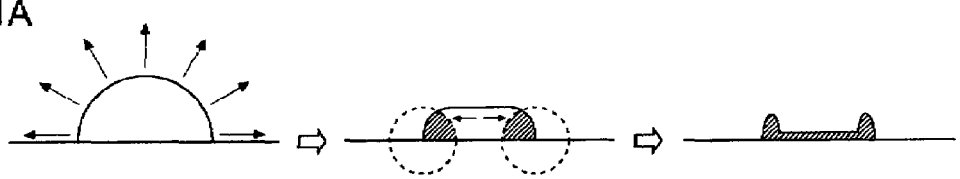
FIG. 1A schematically shows a typical drying process of a droplet.

FIG. 1A schematically shows a typical drying process of droplets.

First, when a droplet containing a film-forming material is arranged on a substrate, generally, drying at the edge of the droplet proceeds quickly. Accordingly, at the initial stage of the drying, liquid evaporates rapidly at the edge of the droplet, and thus the concentration of the solid content, such as the film-forming material, contained in the liquid, tends to rise. If the concentration of the solid content at the edge reaches a saturated concentration, the solid content begins to precipitate at the edge. Due to the precipitated solid content, the edge of the droplet seems to be fixed with pins. Thereby, contraction of the liquid due to the drying is suppressed. Such a phenomenon that contraction of a droplet due to drying is suppressed by a solid content precipitated at the edge of the droplet is called 'pinning'. When the pinning comes about, liquid in the droplet flows toward the edge of the droplet from the center thereof so as to complement the liquid evaporated at the edge of the droplet. Such liquid flow carries a large amount of solid content toward the edge of the droplet, which raises the concentration of the solid content at the edge of the droplet. As a result, a ring-shaped dry film in which the edge of a droplet bulges is obtained.

Figure 1B:
FIG. 1B schematically shows another example of the drying process of a droplet.

FIG. 1B schematically shows another example of the drying process of a droplet. As shown in FIG. 1B, the outer diameter of the droplet can be decreased with the progress of drying by preventing the above-mentioned pinning. This phenomenon is called 'depinning'. This depinning can be caused by decreasing the drying rate of a droplet or lowering the concentration of the solid content in the liquid material. A dry film may also be formed using this depinning.

Next, an example of a method of patterning a dry film which utilizes such a drying process of a droplet will be described.

FIG. 2 is a view for explaining an example of a method of patterning a dry film.

First, as shown in FIG. 2A, droplets including a film-forming material are arranged at predetermined intervals. Then, the droplets spread and combine with adjacent fine droplets, thereby forming a linear droplet. Next, as shown in FIG. 2B, a ring-shaped dry film in which the edge of the droplet bulges is obtained by drying the linear droplet using the pinning phenomenon. Thereafter, as shown in FIG. 2C, a portion (a region surrounded by a dotted line in FIG. 2C) of the dry film which is intended to be used as the etching protective film is subjected to a thermal treatment, if required. The other unnecessary portion is washed away, for example, by arranging a solvent, which does not contain the film-forming material, in the other portion by the inkjet method. Accordingly, it is possible to obtain a dry film which is patterned in a desired shape (see FIG. 2D). In addition, as the solvent that washes away an unnecessary portion of a dry film, a solvent (or a dispersing medium) identical to or different from that contained in the liquid material which is used for forming the dry film may be used. Further, the process shown in FIG. 2C and the process shown in FIG. 2D may be carried out in the reversed order.

In the invention, an etching protective film is formed using the method of forming a dry film and the method of patterning a dry film by precipitating a solid content (a film-forming material) in a droplet in the vicinity of a portion of the droplet, which is called pinning or depinning, as described above.

First Embodiment

FIG. 3 is a view showing the configuration of an inkjet head (referred to as a droplet discharge head) 300 used in a first embodiment. The inkjet head 300 discharges a droplet 10 made of a liquid material 8 containing a film-forming material toward a substrate 400 from a nozzle 310 by a droplet discharge method (a so-called inkjet method).

A body 312 of the inkjet head 300 is formed with a reservoir 308 and a plurality of pressure chambers 306 branched from the reservoir 308. The reservoir 308 defines a flow path for supplying each pressure chamber 306 with the liquid material 8. Further, the bottom of the head body 312 has a nozzle plate that constitutes a discharge surface mounted thereon. A plurality of the nozzles 310 that discharge the liquid material 8 are formed in the nozzle plate correspondingly to each pressure chamber 306. A piezoelectric element 304 is formed such that a piezoelectric material such as quartz is sandwiched between a pair of electrodes (not shown) which is connected to a driving circuit 302.

It is noted herein that when a voltage is applied to the piezoelectric element 304 from the driving circuit 302, the piezoelectric element 304 is deformed so as to expand or contract. When the piezoelectric element 304 is deformed so as to contract, a decrease in pressure in the pressure chamber 306 causes the liquid material 8 to flow into the pressure chamber 306 from the reservoir 308, whereas when the piezoelectric element 304 is deformed to expand, an increase in pressure in the pressure chamber 306 causes the liquid material 8 to be discharged from the nozzle 310.

In addition, although this example is described with respect to a case in which a driving method using the piezoelectric element 304 is used as a method of driving the inkjet head 300, the invention is not limited thereto. For example, an electrostatic driving method, a thermal inkjet method or the like may be used.

A dry film as an etching protective film is formed Using such an inkjet head 300. Hereinafter, a method of forming gate electrodes of thin film transistors, as conductive lines, will be described as an example.

FIGS. 4 and 5 are flow charts for explaining an example of a method of manufacturing thin film transistors.

Figure 4A:
FIG. 4 is a flow chart for explaining an example of a method of manufacturing thin film transistors.

As shown in FIG. 4A, first, a semiconductor film 104 is formed on a substrate (for example, a glass substrate) 102. Specifically, an amorphous silicon film (for example, 100 nm) is formed on the substrate 102 by a low pressure chemical vapor deposition (LPCVD) method. Then, the amorphous film is crystallized with an excimer laser or the like so as to obtain a semiconductor film 104. In addition, the film-forming method of the semiconductor film 104 is not limited thereto, and any film-forming method and semiconductor film material which are well known in the related art may be used.

Figure 4B:
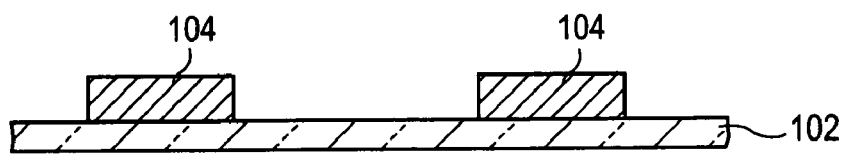
Figure 4C:
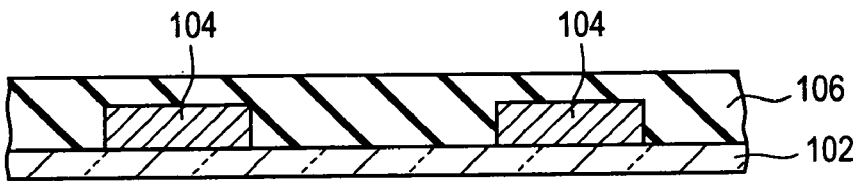

As shown in FIG. 4B, the semiconductor film 104 is patterned in an island shape by photolithography and etching. Thereafter, as shown in FIG. 4C, a gate insulating film 106 is formed on the substrate 102 on which the semiconductor film 104 has been formed. Specifically, silicon oxide or the like is deposited on the substrate 102 by the PECVD method, etc. so that the gate insulating film 106 (for example, 100 nm) is formed.

Figure 4D:
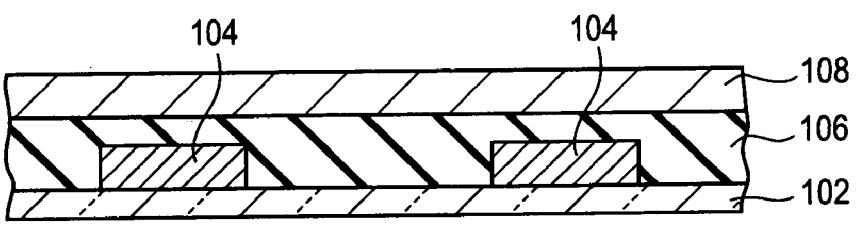

As shown in FIG. 4D, a conductive material such as Ta is formed on the gate insulating film 106 by a sputtering method, thereby forming a conductive film 108 (for example, 200 nm) to be a gate electrode.

Figure 4E:
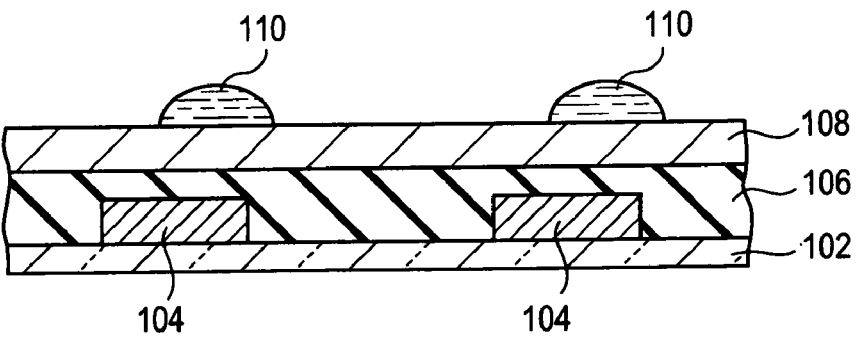

As shown in FIG. 4E, a liquid material 110 containing a film-forming material to form an etching protective film is applied in a pattern in regions on the conductive film 108 where gate electrodes are to be formed, by using, for example, the inkjet method. It is noted herein that, for example, a water dispersion liquid in which gold particles of 0.1 percent by volume are dispersed in water is used as the film-forming material.

Figure 5A:
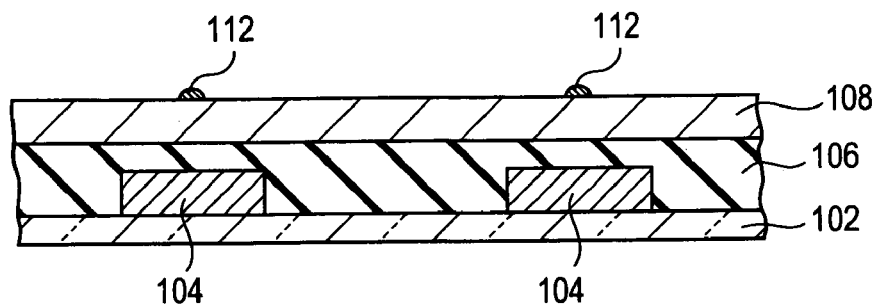
FIG. 5 is a flow chart for explaining an example of the method of manufacturing thin film transistors.

As shown in FIG. 5A, a dry film 112 is obtained as an etching protective film formed in a desired pattern. Specifically, first, the liquid material 110 formed in a pattern as described above is instantaneously dried, for example, at 40° C. for 10 minutes under atmospheric pressure. Then, gold particles are precipitated around the regions to which the liquid material 110 has been applied. The gold particles are sintered by irradiating only one side of the precipitated portion with UV laser beams. Next, ultrasonic cleaning is performed in pure water for 10 minutes to remove gold particles in a non-sintered portion, thereby forming a gate electrode pattern with, for example, a width of 1 micron and a height of 0.3 microns. As a result, the dry film 112 is formed as the etching protective film.

Figure 5B:
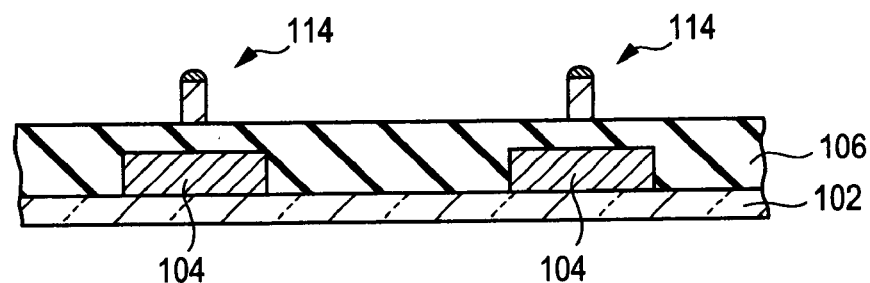

As shown in FIG. 5B, the conductive film 108 is etched while using the dry film 112 as the etching protective film. Specifically, the conductive film 108 is processed by anisotropic etching using an RIE apparatus, etc. so that gate electrodes 114 (for example, a width of 1 micron) composed of gold and Ta are obtained. In addition, the etching method is not limited to the above dry etching, and wet etching may be used. The dry etching is more preferable than the wet etching in that highly accurate etching is possible.

Figure 5C:
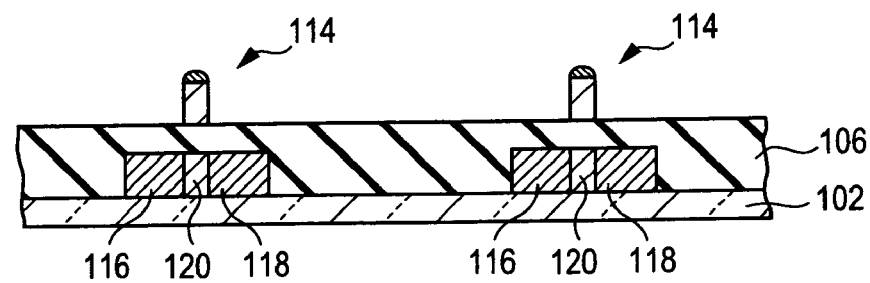

As shown in FIG. 5C, ion implanting is performed using the gate electrodes 114 composed of gold and Ta as a mask to form source regions 116, drain regions 118, and channel regions 120. Specifically, for example, when N-channel metal oxide semiconductor (NMOS) transistors are formed, phosphorous (P) ions as impurity ions having a concentration of $1 \times 10^{16}$ $cm^{-2}$ are implanted into the source regions 116 and the drain regions 118.

Figure 5D:
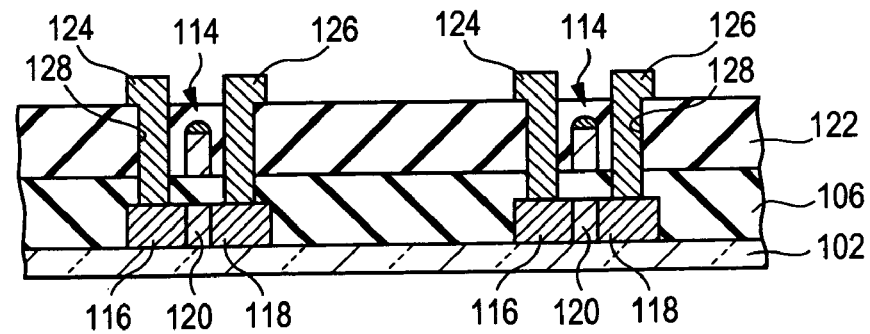

Thereafter, as shown in FIG. 5D, an interlayer insulating film 122 is formed, contact holes 128 for lead electrodes are formed, and source electrodes 124 and drain electrodes 126 are formed. Specifically, the interlayer insulating film 122 such as a silicon oxide film is deposited on almost the entire surface of the substrate 102 including the source regions 116, the drain regions 118, and the channel regions 120 by, for example, the PECVD method. Thereafter, the contact holes 128 are formed, and the source electrodes 124 and the drain electrodes 126 are formed in or around the corresponding contact holes 128. The source electrodes 124 and the drain electrodes 126 can be obtained by, for example, depositing aluminum (Al) by a sputtering method, and forming the deposited aluminum in a desired pattern by photolithography.

According to the present embodiment, ultra-fine thin film transistors having a channel length of, for example, 1 micron can be obtained through simple and easy processes without using photolithography. Further, since the manufacturing cost of masks or the disposal cost of a large amount of waste developer becomes unnecessary, the manufacturing cost can be reduced. Moreover, the conductive-line forming method using the inkjet method of related art allows formation of fine conductive lines if the size of a droplet is made small. However, because of the structural problems of droplet discharge apparatuses (so-called inkjet apparatuses), there is a lower limit to the amount of liquid which can be discharged and there are also limitations to a decrease in size. Presently, conductive lines which can be obtained using the inkjet method are, for example, 10 to 100 microns wide and 0.1 to 5 microns high. However, according to the present embodiment, fine conductive lines having, for example, a width of 0.1 to 10 microns and a height of 0.01 to 1 microns can also be formed.

In addition, although the above embodiment is described taking the gate electrode forming method as an example, other wiring lines such as source lines, drain lines, and gate lines for supplying signals to source electrodes, drain electrodes, and gate electrodes can be formed similarly.

Second Embodiment

Although the above embodiment has been described in conjunction with the method of forming conductive lines such as gate electrodes, a method of manufacturing thin film transistors will now be described taking a method of forming channel regions as an example.

FIGS. 6 and 7 are flow charts for explaining another example of the method of manufacturing thin film transistors.

Figure 6A:
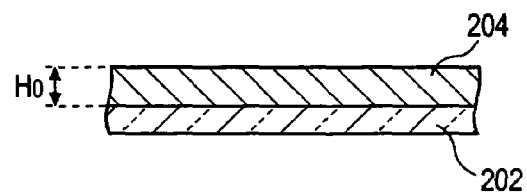
FIG. 6 is a flow chart for explaining another example the method of manufacturing thin film transistors.
Figure 6B:
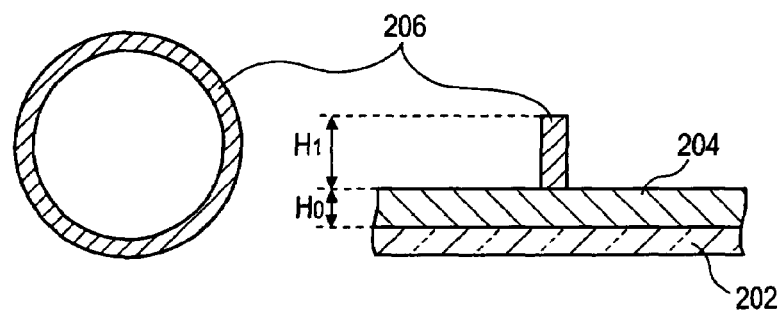

First, as shown in FIG. 6A, a semiconductor film 204 is formed on a substrate (for example, a glass substrate) 202. Specifically, an amorphous silicon film is formed on the substrate 202 by the LPCVD method. Then, the amorphous film is crystallized by annealing with an excimer laser, etc. so as to obtain a semiconductor film 204. It is noted herein that the height $H_0$ of the semiconductor film 204 is formed to be smaller than the height $H_2$ of a source region 210 and a drain region 212 which will be formed in post processes. This allows a better electrical connection between a channel region and the source and drain regions.

shown in FIG. 6B, a liquid material 206 containing a film-forming material to form an etching protective film is arranged and dried on the semiconductor film 204, whereby a dry film 208 as the etching protective film is obtained. At this time, by controlling either the concentration of a solid content (for example, the film-forming material) in the liquid material 206 or the drying rate of the liquid material 206, the dry film 206 is formed in a desired shape. It is noted herein that a dispersion liquid in which silica particles of 1 percent by volume with a particle diameter of 50 nm are dispersed in water as the film-forming material to form the etching protective film. The liquid material is dried, for example, at 20° C. for 2 minutes under atmospheric pressure as drying conditions, so that a solid content can be precipitated at the edge of a droplet to obtain the dry film 206.

In addition, at this time, the sum $H_0+H_1$ of the height $H_0$ of the semiconductor film 204 and the height $H_1$ of the etching protective film is set to be larger than the height $H_2$. This allows electrodes (the source region 210 and the drain region 212), which will be formed in post processes, to be separated on both sides of the etching protective film.

Figure 6C:
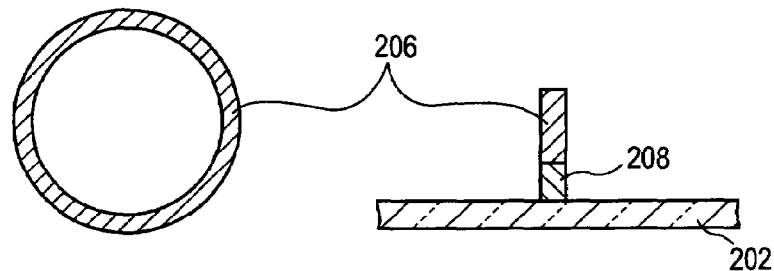

Next, as shown in FIG. 6C, while using the dry film 206 as the etching protective film, the semiconductor film is etched by the RIE apparatus, etc. so that a channel region 208 is formed. The etching is not limited to the above dry etching, and wet etching may be used.

Figure 6D:
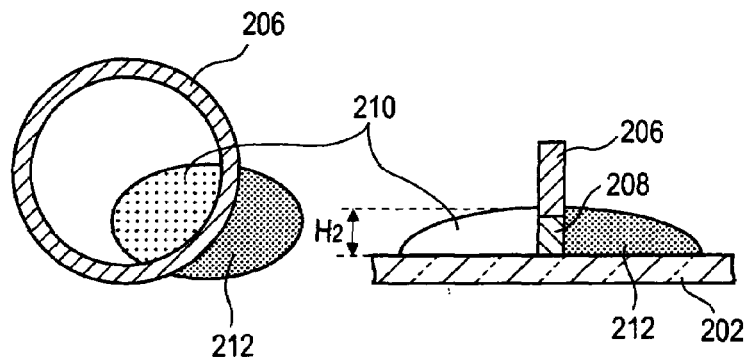

Thereafter, as shown in FIG. 6D, a source region 210 is formed on one side of the channel region 208, and a drain region 212 is formed on the other side of the channel region, each region being made of a metal material such as aluminum or copper, so that at least a part of the channel region is interposed between the source and drain regions. Specifically, for example, a liquid material containing a metal material for forming the source region 210 and the drain region 212 is discharged by the inkjet method, etc. and arranged at a predetermined position. Thereafter, the substrate 202 coated with an electrode material is sintered, so that the source region 210 and the drain region 212 can be obtained. Further, the source and drain regions may be formed by a gas phase method such as a physical vapor deposition (PVD) method and a chemical vapor deposition (CVD) method.

Figure 7A:
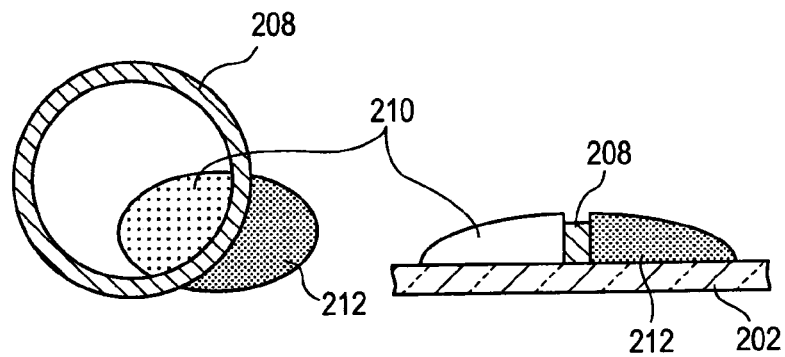
FIG. 7 is a flow chart for explaining another example of the method of manufacturing thin film transistors.

Next, as shown in FIG. 7A, the dry film 206 as the etching protective film is removed by the wet etching or dry etching.

Figure 7B:
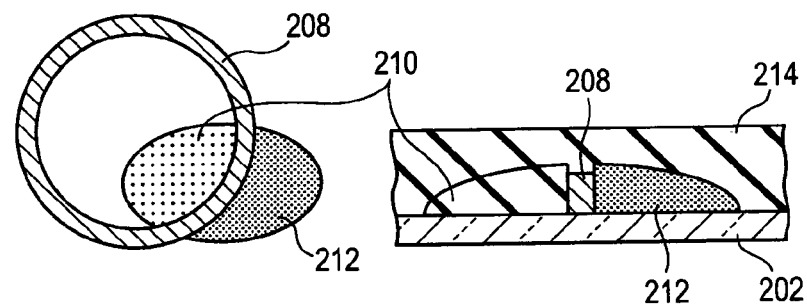
Figure 7C:
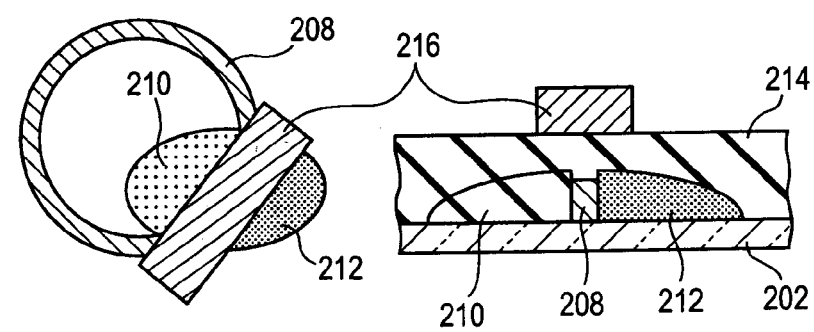

Thereafter, as shown in FIG. 7B, silicon oxide is deposited on substantially one surface of the substrate 202 having the source region 210, the drain region 212, and the channel region 208 formed thereon by, for example, the PECVD method, etc., thereby forming a gate insulating film 214. Next, as shown in FIG. 7C, a conductive material such as Ta is film-formed by the sputtering method, etc., thereby forming a conductive film 216 to be the gate electrode.

Thereafter, an interlayer insulating film which is not shown is formed, a contact hole for leading an electrode is formed, and a source electrode and a drain electrode are formed, so that a thin film transistor is formed.

According to the present embodiment, thin film transistors having a short channel length can be obtained through simple and easy processes without using photolithography.

In addition, although the source region 210 and the drain region 212 are formed using a metal material in the above example, the invention is not limited thereto. For example, the source region 210 and the drain region 212 may be formed using a semiconductor material which is made conductive by doping the material with impurities.

Although the above first and second embodiments have been described taking, as an example the method of manufacturing thin film transistors which utilizes the etching method of the invention, the invention is not limited thereto. For example, the etching method of the invention can also be suitably applied to formation of a fine structure such as formation of banks of organic EL elements.

As described above, the method of manufacturing thin film transistors according to the invention can be suitably used in the method of manufacturing an electro-optical device and the method of manufacturing an electronic apparatus, which include thin film transistors. Here, the electro-optical device is not limited to a liquid crystal display device that is a device which utilizes an electro-optical effect, but it also includes, for example, an organic electroluminescent (organic EL) device and a liquid crystal display device.

FIG. 8 illustrates electronic apparatuses including an electro-optical device 600 (for example, an organic EL device).

Figure 8A:
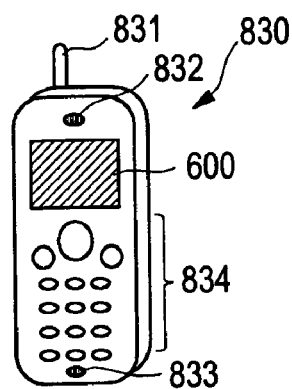
FIG. 8 illustrates various electronic apparatuses including an electro-optical device (for example, an organic EL device).
Figure 8B:
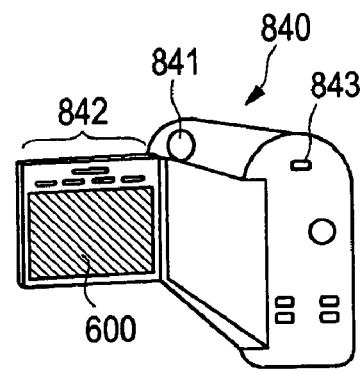

FIG. 8A illustrates a portable telephone as an application. The portable telephone 830 includes an antenna 831, a speech output unit 832, a speech input unit 833, an operation unit 834, and the electro-optical device 600 of the invention. FIG.

Figure 8C:
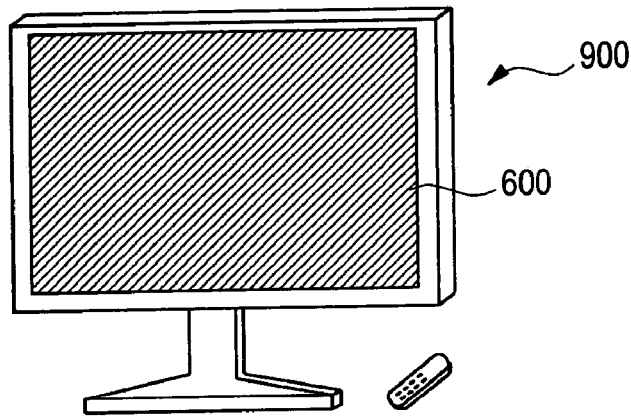
Figure 8D:
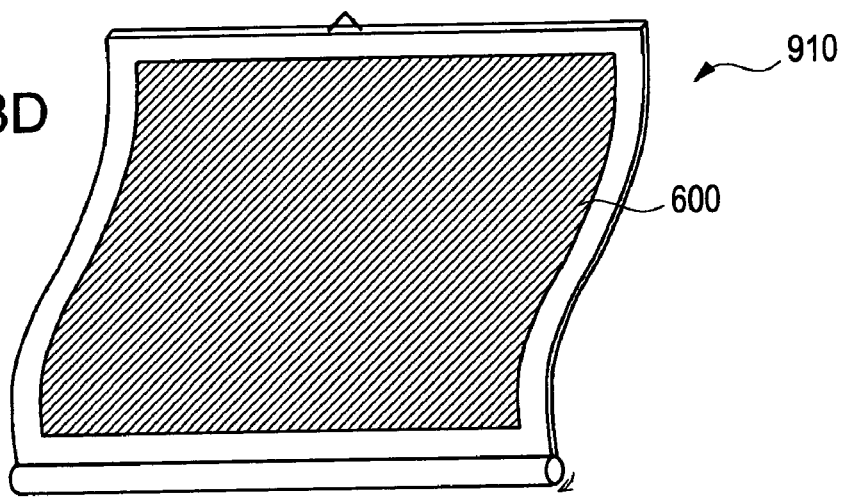

8B illustrates a video camera as another application. The video camera 840 includes an image receiving unit 841, an operation unit 842, a speech input unit 843, and the electro-optical device 600 of the invention. FIG. 8C illustrates a television as still another example. The television 900 includes the electro-optical device 600. Similarly, the electro-optical device 600 can also be applied to a monitor used with a personal computer, etc. FIG. 8D illustrates a roll-up-type television as still another example. The roll-up-type television 910 includes the electro-optical device 600.

In addition, the electronic apparatus is not limited to the above-mentioned electronic apparatuses, and the processing method (etching method of the invention) can be applied to various electronic apparatuses such as, facsimiles with a display function, finders of digital cameras, portable televisions, electronic organizers, electrical scoreboards, displays for advertisement, IC cards, personal digital assistants (PDAs), etc.

What is claimed is:

1. A method of manufacturing a wiring substrate comprising:
    disposing a liquid material on a first film, the liquid material including water as a solvent and a film-forming material and covering a wet part of the first film;
    drying the solvent from the liquid material under atmospheric pressure to convert the liquid material into a second film, the second film covers a dry part of the first film, the dry part covering a smaller part of the first film than the area of the first film covered by the wet part;
    etching the first film except for the dry part of the first film, which is covered by the second film;
    depositing a metallic source material on one side of the dry part and a metallic drain material on a side of the dry part opposite the one side, such that the dry part of the first film, which is covered by the second film, is between the source material and the drain material, the dry part of the first film and the second film forming a barrier with a height higher than a height of either the source material and the drain material; and
    removing the second film so as to leave a channel between the source material and the drain material.

2. The method of manufacturing a wiring substrate according to claim 1, a width of the second film being smaller than a width of the liquid material on the first film.

3. The method of manufacturing a wiring substrate according to claim 1, the second film being a conductive film.

4. The method of manufacturing a wiring substrate according to claim 1, the second film being a nonconductive film.

5. The method of manufacturing a wiring substrate according to claim 1, the second film being a gate electrode of a transistor.

6. A method of manufacturing an electro-optical device using the method of manufacturing a wiring substrate according to claim 1.

7. A method of manufacturing an electronic apparatus using the method of manufacturing an electro-optical device according to claim 6.

8. The method of manufacturing a wiring substrate comprising:
    disposing a liquid material on a first film, the first film having a first height, and the liquid material including a solvent and film-forming material and covering a wet part of the first film;
    drying the solvent from the liquid material to convert the liquid material into a second film, the second film having a second height, and covering a dry part of the first film smaller than the area of the first film covered by the wet part;
    etching the first film except for the dry part of the first film;
    depositing a metallic source region on a first side and a metallic drain region on a second side of the second film; and
    forming a short channel region located between the source region and the drain region by etching the second film,
    a sum of a height of the first film and a height of the second film being greater than the height of the source region and the drain region and the height of the first film being smaller than a height of either the source region and the drain region.

9. The method of manufacturing a wiring substrate according to claim 1, wherein a thin film transistor is formed.

* * * * *